(12) United States Patent
Zandbergen

(10) Patent No.: US 9,887,065 B2
(45) Date of Patent: Feb. 6, 2018

(54) LOW SPECIMEN DRIFT TEM HOLDER AND COOLER FOR USE IN MICROSCOPY

(71) Applicant: Technische Universiteit Delft, Delft (NL)

(72) Inventor: Hendrik Willem Zandbergen, Delft (NL)

(73) Assignee: TECHNISCHE UNIVERSITEIT DELFT, Delft (NL)

( * ) Notice: Subject to any disclaimer, the term of this patent is extended or adjusted under 35 U.S.C. 154(b) by 0 days.

(21) Appl. No.: 15/171,913

(22) Filed: Jun. 2, 2016

(65) Prior Publication Data

US 2016/0276126 A1  Sep. 22, 2016

Related U.S. Application Data

(63) Continuation of application No. PCT/NL2014/050825, filed on Dec. 2, 2014.

(30) Foreign Application Priority Data

Dec. 2, 2013 (NL) ..................................... 2011876

(51) Int. Cl.
*H01J 37/20* (2006.01)
*H01J 37/26* (2006.01)

(52) U.S. Cl.
CPC .............. *H01J 37/20* (2013.01); *H01J 37/26* (2013.01); *H01J 2237/2001* (2013.01); *H01J 2237/20207* (2013.01); *H01J 2237/26* (2013.01); *H01J 2237/2802* (2013.01)

(58) Field of Classification Search
CPC .... H01J 37/20; H01J 37/26; H01J 2237/2001; H01J 2237/20207; H01J 2237/2802; H01J 2237/26
USPC ................ 250/440.11, 441.11, 442.11, 443.1
See application file for complete search history.

(56) References Cited

U.S. PATENT DOCUMENTS

| | | | |
|---|---|---|---|
| 3,896,314 A | 7/1975 | Nukui et al. | |
| 4,950,901 A | 8/1990 | Jones et al. | |
| 5,857,342 A | 1/1999 | Rohlfing et al. | |
| 2006/0097187 A1* | 5/2006 | Zandbergen ............ | H01J 37/20 250/440.11 |
| 2012/0112064 A1 | 5/2012 | Nagakubo et al. | |
| 2012/0294329 A1* | 11/2012 | Miller .................... | G01N 25/18 374/44 |
| 2013/0175005 A1* | 7/2013 | Gowdaru .......... | H01L 21/67109 165/84 |
| 2014/0326707 A1* | 11/2014 | Schmitz ................ | G01Q 30/02 219/201 |

FOREIGN PATENT DOCUMENTS

| | | |
|---|---|---|
| EP | 1516349 | 9/2010 |
| WO | 2015/084169 | 6/2015 |

* cited by examiner

*Primary Examiner* — Nicole Ippolito
(74) *Attorney, Agent, or Firm* — Peacock Myers, P.C.; Jeffrey Myers

(57) ABSTRACT

A low specimen drift holder and cooler for use in microscopy, and a microscope comprising said holder. The present invention is in the field of microscopy, specifically in the field of electron and focused ion beam microscopy (EM and FIB). However it application is extendable in principle to any field of microscopy, especially wherein a specimen is cooled or needs cooling.

14 Claims, 4 Drawing Sheets

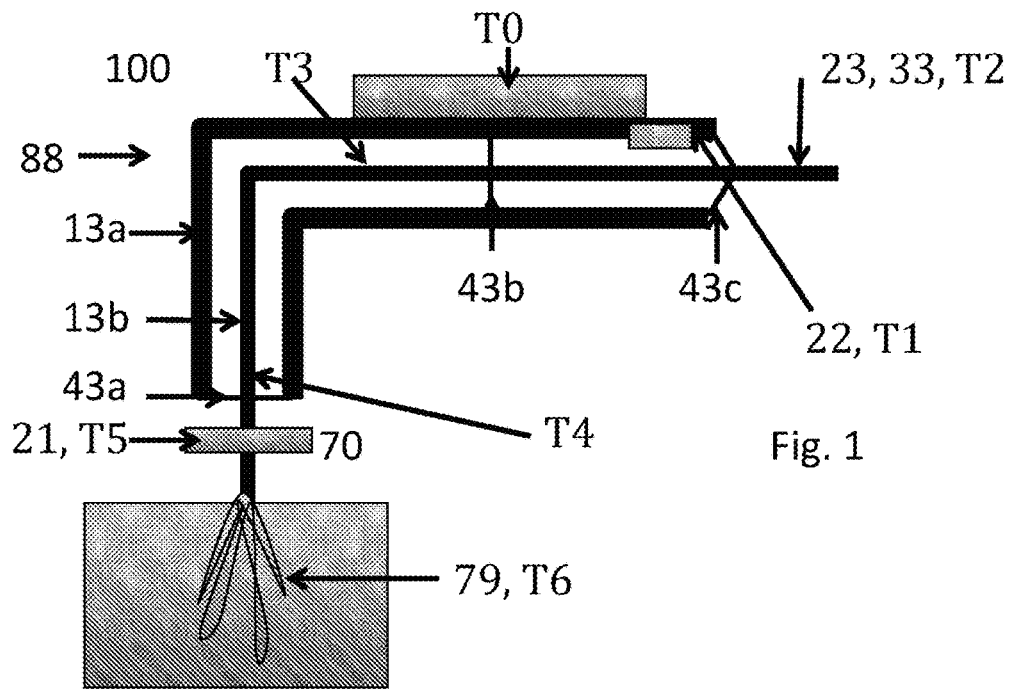
Fig. 1
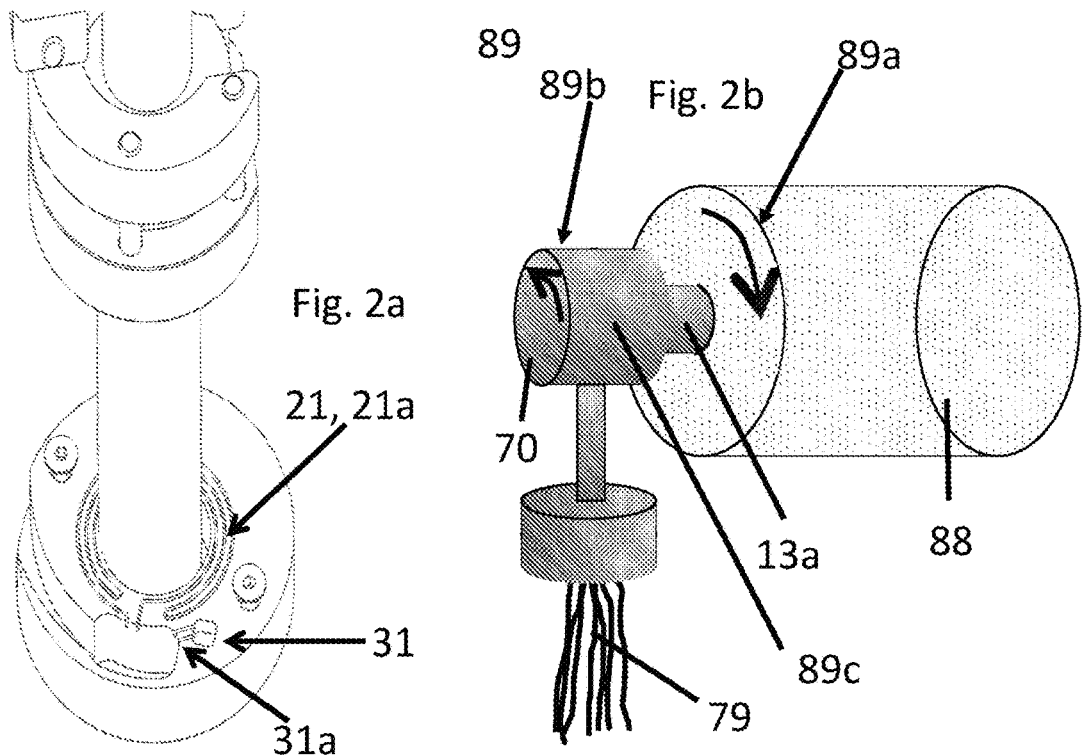
Fig. 2a
Fig. 2b

LOW SPECIMEN DRIFT TEM HOLDER AND COOLER FOR USE IN MICROSCOPY

CROSS-REFERENCE TO RELATED APPLICATIONS

This application is a continuation of International Application PCT/NL2014/050825, entitled "Low specimen drift TEM holder, cooler and heat flow reducer for use in microscopy", to Technische Universiteit Delft, filed on 2 Dec. 2014, which claims priority to Netherlands Patent Application Serial No. 2011876, filed 2 Dec. 2013, and the specifications and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

FIELD OF THE INVENTION

Technical Field

The present invention is in the field of a low specimen drift holder and cooler for use in microscopy, and a microscope comprising said holder.

Description of Related Art

The present invention is in the field of microscopy, specifically in the field of electron and focused ion beam microscopy (EM and FIB), and in particular Transmission Electron Microscopy (TEM). However its application is extendable in principle to any field of microscopy, especially wherein a specimen (or sample) is cooled or needs cooling.

Microscopy is a technique used particularly in semiconductor and materials science fields as well as for biological samples for site-specific analysis, and optionally deposition, and ablation of materials. Also it is widely used in life sciences to obtain information in the 0.1 nm to 1 μm resolution domain. In microscopy typically a source is used to obtain an image. The source may be a source of light, electrons, and ions. Further scanning techniques have been developed using e.g. atomic force (AFM) and scanning tunnelling. Under optimal conditions a modern microscope can image a sample with a spot size typically in the order of a few tenth of nanometers for a TEM, a nanometer for a FIB and Scanning (S)EM, and a few hundred nanometers for an optical microscope.

Microscopes are typically optimized for use at ambient temperature. The microscope and elements of the microscope are therefore preferably substantially at a same temperature. With e.g. a transmission electron microscope a resolution of about 0.1 nm can then be achieved. A drawback of various types of microscopes is that a sample can not be viewed or imaged optimally, e.g. in that not all or some sample details considered relevant are visible in the image, if the sample is at an elevated or at a reduced temperature, compared to ambient temperature. A sample suffers from largely uncontrolled drift, wherein the drift is largely caused by expansion/shrinkage of (elements of) the microscope and may further be in the sample itself, even in short periods of time. A sample is typically fixed into the holder and the holder is fixed as well. Typically an image is formed in about a second. During image formation (e.g. 1 second) a relative drift typically is from −0.5 nm to +0.5 nm, at best. The resolution may be somewhat better. It is important to realize that said drift is in the same order as the resolution, or larger. Effectively the resolution is than reduced to at the best 0.3 nm (for a TEM), but typically to about 1 nm or more. If a temperature change is introduced to a sample it typically takes a long period of time, in the order of 5 minutes to 60 minutes, before drift is more or less stabilized. During that time no image formation is possible, effectively. In other words, no continuous image formation is possible; and thus no continuous measurements can take place. So at constant elevated or reduced temperature some resolution is lost, whereas during increase or decrease of temperature (of the sample) effectively no measurement is possible.

Such is especially relevant if samples need to be cooled to e.g. about liquid nitrogen temperature, such as in the case of cryo tomography EM, which may be the case for biological samples. Prior art systems and specifically holders thereof have not improved in this respect for the last 20 years to the knowledge of the inventors. These systems typically allow not more than a limited tilt of the sample, they introduced (too much) weight to a holder, they are difficult to manipulate, they can not be tilted as required, and they pass vibration of a cooling system on to a sample and thus reducing resolution. In other words, these prior art systems are not suited for sophisticated purposes. For instance, some but in most cases not sufficient compensation for thermal expansion may be provided in the form of a piezo-electric element; therewith expansion can be compensated up to about 1 μm, which may be suited if a microscope is at a constant and ambient temperature; however, upon larger temperature variation of a sample/microscope expansion can be in the order of 100 μm, or larger, so the element is not suited in most other cases.

Some prior art documents recite cooling elements. Despite that many of the below cooling elements have been used for decades in various settings, no adequate measures have been found to control drift thereof.

U.S. Pat. No. 4,950,901 (A) recites an improved specimen cooling holder for transmission electron microscopy is described. Low thermal conductivity pins near the specimen and an improved conductor/Dewar connection reduce specimen vibration, providing improved image resolution. Multiple heaters facilitate accurate temperature control and bake out procedures. The cooling holder is known in the field as having a large drift when used at a temperature other than that of the microscope; even worse, the drift is totally unpredictable, both in time (when will the temperature increase or decrease) and in place (which part will drift and in which direction). The heater is used to heat the cooling rod, and not to control the temperature thereof; control of a temperature is clearly much more difficult, and thus the heater is not suited for control. Further a cold flux is directed to the goniometer, which makes control of a temperature of a sample almost impossible. The holder has been found totally inadequate for the purpose of precise temperature control thereof and is totally unsuited for achieving temperature stability.

EP 1 516 349 A1 (of the present inventors) recites a specimen holder for an electron microscope, comprising a rod-shaped part, which is provided near one end with a tip, which tip is arranged to receive a specimen, the rod-shaped part, in use, extending with at least the tip into the electron microscope, held by clamping means present in the electron microscope, wherein first temperature control means are provided to control the temperature of the rod-shaped part and/or the clamping means, such that this rod-shaped part and the clamping means substantially have the same temperature, at least at the location of their contact surfaces. The temperature of the specimen holder is only controlled to some extent, as has been identified. It is noted that a temperature control of ±0.1K is totally insufficient as it leads to a drift of about 100 nm. Also inadequate control leads to (unexpected) drift as well.

U.S. Pat. No. 5,857,342 (A) recites a temperature controlled cryogenic package system for efficiently and precisely monitoring and controlling the operating temperature of a high temperature superconductor circuit placed on a substrate. The cryogenic package system comprises a heating element formed on the same substrate as the high temperature superconductor circuit, a control circuit capable of activating and deactivating the heating element, and a temperature sensor placed in thermal proximity to the high temperature superconductor circuit. The temperature sensor monitors the operating temperature of the high temperature superconductor circuit, and conveys temperature information to the control circuit. The control circuit activates or deactivates the heating element according to the warming or cooling effect that is necessary in order to maintain the high temperature superconductor circuit within a predetermined temperature range, where the range of temperature fluctuation is within plus or minus 0.1 K of a predetermined temperature. Such a temperature is totally unacceptable in view of drift.

U.S. Pat. No. 3,896,314 A recites a specimen heating and positioning device for electron microscopes comprising a specimen stage adjustably fixed to the microscope column for positioning the specimen along the optical axis. The stage is arranged to expand on heating along an axis perpendicular to the optical axis and away from a first reference point fixed relative to the optical axis. A specimen holder is mounted in the specimen stage. The holder is arranged to expand on heating along the same axis along which the specimen holder expands away from a second reference point fixed relative to the specimen stage and on the opposite side of the optical axis from the first reference point. Means are provided for heating the specimen. The distances between the reference points and the optical axis can be selected such that as the specimen holder and specimen stage are heated, the thermal expansion of the specimen stage and the specimen holder are approximately equal, thus maintaining the specimen substantially at the optical axis. The amount of heat used (>1 W) for temperature experiments is bound to create huge troubles in terms of drift.

US 2012/112064 A1 recites a sample holder for efficiently performing the processing or observation of a sample by means of charged particles while cooling. Particularly, disclosed is a sample holder whereby the processing or observation of a material which may be affected by the influence of heat damage can be performed in a state in which the material is cooled and the influence due to a sample processing method using charged particles can be reduced by cooling. The sample holder is provided with a sample stage capable of fixing a sample piece extracted from a sample by ion beam irradiation, and a rotation mechanism for rotating the sample stage in a desired direction, which can be attached to an ion beam device and a transmission electron microscope device, and which has a movable heat transfer material for thermally connecting the sample stage and a cooling source, and an isolation material for thermally isolating the sample stage and the heat transfer material from the outside. According to the sample holder, the processing or observation of a sample by means of charged particle beams can be performed while efficiently cooling. This sample holder is for (focussed) ion beam, which has a relatively poor resolution of ±10 nm, amongst others due to sample vibration. It is not capable of creating counter rotation around an axis of the holder. Rotational resolution is poor.

The present invention therefore relates to a holder and cooler for use in (combination with) microscopy, and a microscope comprising said holder and cooler, which solve one or more of the above problems and drawbacks of the prior art, providing reliable results, without jeopardizing functionality and advantages.

BRIEF SUMMARY OF THE INVENTION

The present invention relates to a holder according to claim 1, a cooler according to claim 14, and a microscope according to claim 13 which amongst others have reduced drift, reduced heat flux, and improved and active temperature control. For convenience of the reader a table with reference numerals is incorporated below.

The present holder 100 provides a low specimen drift, such as smaller than 0.1 nm/s. The present holder provides mechanical and temperature stability. Therewith a resolution obtainable at ambient temperature is now (again) available at elevated and reduced temperature. The present holder can be used in a relatively broad temperature domain, such as from about 70 K-1000 K. The improved control and resolution makes the present holder especially suited for material science, e.g. to study phenomena that occur in or over the broad range of temperature mentioned, as well as for biological science studies at relatively low temperature.

The present holder provides a rapid and controlled change of specimen temperature. As such changes in the sample due to temperature change, such as a phase transition, solidification and melt, can now be monitored, as the specimen drift is substantially absent.

By providing a stable temperature, cryo tomography EM, as on biological samples, is now possible. It is noted that dedicated systems may be available for this purpose, but these systems are complex, expensive, involve further specific elements, etc. The present holder can be fitted in a conventional (life or material) science TEM. Therewith good quality (tomography or material) data over e.g. a range of temperatures can be obtained. The present resolution is better than 0.2 nm, which is required for biological samples, and also better than 0.1 nm, which is required for material science samples.

In the present holder an inner section 13b, an outer section 13a, supports 43, a coldness influx stabilizer 70, a first heat provider 21 and a second heat provider 22 are present. The inner section 13b up to a tip of the holder and coldness influx stabilizer 70 up to a coolant taken together may be considered as a cooling rod. Within the description reference to a "tip" indicates a section of the holder from support 43c towards the end of the holder, whereby the specimen cradle and an optional heater 24 are embedded in the tip. Some supports, e.g. 43a, also function as a (vacuum) seal.

The outer section is preferably fixed tightly to a goniometer or the like by a fixing means. The inner and outer sections are thermally insulated from each other.

With reference to FIG. 1 the following is illustrated.

In an example the present invention provides a means to keep temperatures T0, T1 and T2 virtually constant, or controlled, or controllable; the means can be used in an equivalent fashion for the three options mentioned. Such a control of temperatures is totally different from prior art holders wherein e.g. heaters are controlled individually, but not in combination. As a result no drift due to temperature variations is observed or can be compensated actively. It is noted that if a temperature T0 of the goniometer 88 (of which a position is roughly indicated) would vary, parts in the goniometer will expand or contract, which will result in drift. Unfortunately said drift is rather unpredictable, e.g. because of complexity of the goniometer. The drift may result in resolution loss.

If the temperature T1 of the outer section 13a is varying the holder contracts or expands (mainly a drift along the holder main axis), which results in drift and most likely resolution loss. Also if T1 is varying T0 will vary, which is undesired. In an example it is a goal to have T1 as much as possible equal to T0.

Thus by keeping T1 constant also T0 will be constant, provided there are no other causes for temperature fluctuations. If T0, T1 and T2 are constant the drift of a sample should be similar to the drift of a simple TEM holder operating at ambient temperate, since the specimen is connected to a supporting (fixing) means 43c through the tip, the outside section and the goniometer. T1 can be maintained at a constant temperature value using a heater in the outside section. By making T1 and T2 stable, the heat flux from the outside section to the tip is also constant.

Inventors have managed to keep the coldness flow to the tip constant. Thereto a constant temperature difference between the tip of the holder and a part of the coldness influx stabilizer at some distance away from the cooler is provided, such that a stable temperature at this location is achieved. The distance is large enough to achieve a stable temperature and may vary upon design of the holder, i.e. somewhat closer or somewhat further away from the cooler. If the cooling efficiency of the cooler decreases in time (e.g. because the cooling liquid is evaporating (slowly)), the coldness flow will decrease. To counteract this fact a heater 21 can be added, to correct for the change in the coldness flow, which is somewhat contra-intuitive. With a decreasing coldness flow from the cooler also heating by the heater is controlled to gradually drop at a similar rate. Inventors assume that other coldness losses have (virtually) no influence on the drift or the resolution.

If T2 is varying, and T1 is stable, the tip will expand or contract and thus also the part of the tip between the sample and the connector 43c to the outside section will contract of expand, which will result in drift (mainly a drift along the holder main axis). Such a drift can be compensated by a controlled change of the temperature T1 of the outer section.

If the specimen is heated as well (e.g. by a microheater 23) a change in temperature of the microheater will result in an imbalance of the heat. This instability is small since the microheater only consumes a minimal amount of power, such as 1-4 mW, compared to e.g. 10 W of first heater 21. In experiments performed with an (T)EM typically the low drift regime is restored very quickly, such as after a change in T of 100 K in about 1 minute. Obviously the less heat needed for the microheater e.g. to maintain a certain temperature the lower the induced drift will be.

The present holder also is capable of providing double tilt, a first tilt provided by the goniometer and the second tilt (88b) provided by the (specimen) cradle.

The present holder is suited for advanced material science research, e.g. at cryogenic conditions, and control of advanced manufacturing, such as semiconductor manufacturing.

The present holder provides ultra-high resolution imaging over a huge temperature range, very low specimen drift, allowing imaging of in-situ changes, and is user friendly, such as by providing controls and measurements of an actual sample temperature.

The present holder comprises a Specimen cradle 14. Therein a sample to be imaged can be provided.

In order to form images of the sample at a different location thereof (the sample typically is much larger than an image being formed) and/or at a different orientation, such as under an acute angle, a manipulation device, such as a goniometer 88, is provided.

In order to reduce a temperature and/or to maintain a temperature at a reduced temperature a coldness influx stabilizer 70 is provided.

On top of that, the holder comprises two or more heaters (21, 22), for balancing a cool flux. The cool flux may for the purpose of this description be taken as a heat flux, with a negative sign (or direction).

The coldness influx stabilizer heater 21 regulates an amount of coldness flowing into the present holder. The inflow is balanced by the heating element in the coldness influx stabilizer 70, such that a net coldness inflow is substantially constant, if a temperature of the sample is to remain stable. The heat providers (21-22) maintain the tip of the holder at a predetermined temperature, or likewise, as above, lower or rise the temperature, by providing direct heat to the holder, especially a part near to the sample. The heat provision is regulated, preferably together with the coldness inflow, in order to balance the heat transfer. Ideally the coldness transfer towards to holder is as required; in case the temperature needs to remain at a constant value the coldness transfer variation is 0 W; in case the temperature is required to rise or to lower the coldness transfer variation is negative or positive, respectively; i.e. extra heat is provided or less heat is provided. The amount of coldness transfer in the latter two cases is balanced, such as by a controller and software. Typically one or more temperature sensors are provided, to measure the temperature (change) at various locations of the present holder.

Optionally some compensation for heat influx from the environment may be taken into account to balance the coldness inflow. If a temperature of the sample is required to rise, an option is that the coldness inflow is reduced (effectively less coldness flows towards the sample), and regulated. Likewise, if a temperature of the sample is required to lower, the coldness inflow is increased (effectively coldness flows towards the sample), and regulated.

The present invention also relates to an improved cooler 200, for providing a controlled coldness inflow of the present holder.

The present invention also relates to an improved microscope comprising the present holder, and optionally connected to the present cooler.

Thereby the present invention provides a solution to one or more of the above mentioned problems and drawbacks.

Advantages of the present description are detailed throughout the description.

DETAILED DESCRIPTION OF THE INVENTION

The present invention relates in a first aspect to a low specimen drift holder according to claim 1.

In an example of the present holder the first heat provider 21, i.e. the coldness influx stabilizer heater, has a maximum heating capacity of 10 W-1 kW, and/or wherein the second heat provider 22 has a (much smaller) maximum heating capacity of 0.001 W-10 W. It has been found after thorough scientific research that the coldness influx stabilizer heater 21 preferably provides a significant amount of heat, but not necessarily a high amount. A heater with a capacity of 10 W-1 kW is in general sufficient for balancing coldness in the holder.

It has been found after thorough scientific research that the second heat provider 22 has a maximum heating capacity of 0.001 W-10 W, which is considered a relatively small capacity. The smaller capacity is in general sufficient for balancing coldness flow in (a further part of) the holder. As a result also specimen drift, of a sample in the cradle 14, is controllable and typically very small, such as less than 1 nm/sec, typically less than 0.1 nm/s. Such is very much acceptable in view of operation.

In the present holder the coldness influx stabilizer heater 21 comprises a temperature sensor 31, software and a heat regulator 81. The temperature sensor 31 is capable of detecting temperature changes in the order of mK. The heat regulator is preferably adapted to damp temperature fluctuation in the tip by modifying an amount of heat provided by heater 21 in order to maintain an average temperature of the coldness influx stabilizer 70 within 1 K fluctuation (per 10 seconds (1/30 Hz)), preferably within 50 mK, more preferably within 10 mK, such as within 2 mK. It has been found after thorough scientific research that by precisely measuring the temperature in the coldness influx stabilizer, heat regulation and control of the temperature of the holder tip is grosso modo established. Thereto the results of the measurements are used; typically software is used to calculate a required amount of heat at a certain moment; also a prediction of an amount of heat for a following period of time is typically calculated. Variations in temperature measured are typically treated statistically; an uptrend or down trend in temperature is determined in an early stage, typically using control boundaries. In the uptrend or downtrend in an early stage a slight correction is already provided. As a result the temperature typically remains within control boundaries, as set. Fluctuation is as a result damped. Typically damping action is provided at regular time intervals, based on measurements and requirements obtained and calculated with a frequency of 10 Hz-1 kHz, preferably 20 Hz-100 Hz, such as 30 Hz.

In an example of the present holder the coldness influx stabilizer heater 21 comprises a solid thermal conducting part 11a, having a volume of 1-100 cm$^3$, preferably 2-25 cm$^3$, a surface area of 1-200 cm$^2$, preferably 2-50 cm$^2$, preferably having a thermal heat conductivity λ of >50 (W/(mK, @293 K), preferably >150 (W/(mK), such as larger than 300 (W/(mK), preferably a copper part. It has been found after thorough scientific research that in order to provide sufficient cooling or heating action within a given time frame the coldness influx stabilizer heater 21 comprises a solid thermal conducting part 11a that is preferably large enough and has a good thermal conductivity. In an example a copper part with a surface area of 30 cm$^2$ having a volume of 15 cm$^3$ is used, which gives good results.

In an example of the present holder the outside section heat provider 22 comprises a heating wire 22a, having a maximum heat capacity of 0.1 mW-10 W, and optionally a temperature sensor 32. The temperature sensor is evidently used to measure a (relative) temperature; the result of the measurement may be used to regulate and control the heat transfer.

In an example the present holder comprises a sample microheat provider 23. It has been found after thorough scientific research that it is preferred to provide as little heat as possible to the sample to reach or maintain a given temperature and thus it is preferred to use a heater on which the specimen is located, whereby the heat transfer from the heater/specimen to the holder is as small as possible. This can be realised with a MEMS device with a microheater in a thin membrane for instance 1 micron thick SiN. The heater (MEMS device) preferably comprises a temperature sensor and a heater, in order to rapidly decrease or increase the temperature in a controlled and reproducible manner.

In an example of the present holder the sample microheat provider 23 comprises an first electrically controlled heat device 23a, having a maximum heat capacity of 0.001 W-1 W, preferably 0.01 mW-1 W, such as 0.1 mW-0.5 W, and optionally a temperature sensor 33. Temperature stability is better than a required temperature ±4 mK. The temperature sensor is evidently used to measure a (relative) temperature; the result of the measurement may be used to regulate and control the coldness influx. The temperature sensor as well as the heater are preferably a MEMS device.

In an example the present holder comprises a holder tip microheat provider 24 and optionally a temperature sensor 34. The objective of the pair is to adjust for small changes in the tip of the holder, for instance in the (±) 10 mK range. In this manner even a small change in the temperature of the tip can be compensated. In this example the tip heat provider 24 comprises a first electrically controlled heat device 24, having a maximum heat capacity of 0.0001 W-0.010 W, and preferably a temperature sensor 34. The temperature sensor is evidently used to measure a (relative) temperature; the result of the measurement may be used to regulate and control the temperature of the tip.

As a result of the heat providers, also specimen drift, of a sample in the cradle, is even better controllable and typically very small, such as less than 0.2 nm/sec, typically less than 0.05 nm/s. It has been found that under most experimental conditions envisaged the resolution (of an image obtained) is as a result better than 0.1 nm, within a given time typically required for forming an image.

In an example of the present holder the inner section 13b comprises at least one internal resonance damper 43b attached to the outer section 13a. In view of heat transfer it is preferred to have a separate inner section and outer section. In an example the internal resonance damper 43b comprises three polymer wires having a good strength and a low thermal conductivity. The three wires are fixed to the outer section and enclose the inner section substantially. It has been found that resonance and vibration in the inner section is not noticeable as a consequence. Such further contributes to the stability of the specimen cradle 14.

In an example of the present holder the coldness influx stabilizer 70 comprises a high surface/volume ratio coolant contact element 79, such as a "beard", in order to prevent bubbles. The beard is typically largely but not fully immersed in the cooling liquid. It is preferred to prevent formation of bubbles, as the resolution is jeopardized in such a case. The beard therefore preferably has "hairs" with a diameter of less than 1 mm, more preferably less than 0.1 mm. The beard is preferably spread out as much as possible. It has been found that for such a beard bubble formation (of larger bubbles) is virtually absent.

In an example the present holder comprises a counter rotation device 89 (FIG. 7), wherein the counter rotation device is capable of counter rotating the coldness influx stabilizer 70 over an angle of ±90 degrees. Such a counter rotation device provides a large degree in freedom in terms of rotation of the sample and good accuracy, whereas e.g. the beard remains in the same position (in the liquid nitrogen). Such degree of freedom is also contrary to some prior art devices, wherein e.g. only an inner section can be rotated (only one angle).

In an example the present holder comprises a temperature sensor 33 in the specimen cradle 14 for determining a temperature in the sample.

The sample, optionally being at a different temperature than the tip, is preferably thermally insulated, such as by a bridge or thin membrane, from a remainder of the tip.

In an example the present holder comprises further means for controlling expansion and thermal flux. The thermal expansion regulator 98 preferably has a thermal expansion coefficient of $<10*10^{-6}$ (m/mK) (@293° K.), and a thermal conductivity of $>75$ (W/(mK) (@293° K.), preferably $>125$ (W/(mK). In an example the regulator 98 is an outside section 13a, and it may also relate to an additional part of the holder, the additional part preferably having a high thermal expansion coefficient. Suitable materials are metals, such as Mo, W, Ir, Si, and Cr, and alloys having the above properties. It is preferred that the outside section 13a is substantially made of the aforementioned metal or alloys, especially a part thereof close to the tip. In an alternative the outside section may be made of a material with a similar thermal heat conductivity (e.g. $>75$ (W/(mK)(@293° K.)) but with a somewhat large thermal expansion coefficient of $<10*10^{-6}$ (m/mK)(@293° K.), such as Cu, Ni, Ti and Al, preferably Cu.

The present holder comprises as further means for controlling expansion and thermal flux a (Ti) grid heat flow reductor 97 adapted to minimize heat flux from outer section to tip. There is limited heat transfer as a consequence between tip and outside section, in fact the heat flux has been reduced by at least a factor 10. Presently one uses some kind of cryostable polymer as connection between outside section and tip, but the heat conductance through this polymer (also because it is uses as a sort of thick glue between two metal parts) is quite high. Use of the Ti grid can reduce the heat transfer. In this respect it is preferred to use a Ti grade 5 material or the like. This requires that it is vacuum tight if cryotransfer is needed. Especially heat transfer from the tip of the holder to the outer section is reduced significantly.

The (Ti) grid 97 can be covered with a metal film, thereby forming a closure. The film can for instance be Ti, which metal film provides the (Ti) grid a vacuum tight sealing. The metal film is preferably applied at the inside section (the grid) of the heat flow reductor. The thickness of the film is preferably 250 nm-2 μm, such as 500 nm-1 μm. This allows for a holder in which the specimen can be placed in the specimen cradle 14 somewhere outside of the microscope under cryogenic conditions and next be placed into the TEM while keeping the sample all the time at cryogenic temperature. Therein maintenance of vacuum is considered critical. This is called cryotransfer. Suitable further materials for the film are metals, such as Mo, W, Ir, and Cr, and alloys having the above properties.

In an example, is shown in FIG. 9, the grid has openings arranged in a matrix. The openings have a width of 5-20% of a length thereof. It is preferred to have openings which are interrupted by small remaining parts of the grid material, or as an alternative are provided with bridging elements. It has been found that addition of such interruptions reduce a stiffness by a factor 10, without noticeably changing heat transfer. Sideward stability has as a result improved from ±1 nm to ±0.3 nm.

In a further example the grid may comprise further subparts. The thin film, to create a vacuum tight (Ti) grid in the inside part of the (Ti) tube, is made by taking more than one, such as two, (Ti) grid tubes arranged inside/outside one and another. The thin film is than on the outside of the inner (Ti) grid tube.

In an example the present holder comprises a controller 88a for manipulating a sample (tilting) in the specimen cradle 14 optionally comprising a membrane, and a multiple sample tilt device 88b. As such the sample can be orientated as desired.

Further heaters may be provided, such as in the tip. Even further a first heater 23a may control a second heater 23b, e.g. in a master slave relation. A first heater may provide a base line amount of heat, the second heater may be used for compensation of temperature variation.

In an example a section of the inner section 13b may comprise further means for allowing free expansion of the inner section 13b in the holder, whereby the tip—inner section connection is fixed and the other side of the inside section can expand or contract freely, which can be e.g. achieved by flexible wires of a good conducting high expansion material, such as copper. Also the outer section 13a, close to the coldness influx regulator, may comprise a thin tube (0.1-0.5 mm thick) in order to reduce coldness loss to the outer section. In a second aspect the present invention relates to a cooler (see e.g. FIG. 6) for providing mechanical and temperature stability such as to a microscope, comprising a container 71 for a first coolant 73, a first small inlet 77a, a first outlet 76a comprising an opening 76e for a coldness influx stabilizer 70, and a first coolant replenish unit 77, wherein a surface area 76e of the outlet is smaller than 25%, preferably smaller than 10%, such as smaller than 5% of a surface area 73e of the coolant. As such a level of the coolant can be regulated effectively. The outlet opening is preferably large enough to allow rotation of goniometer 88. If a counter rotation is provided, the outlet opening may be smaller. As the coldness influx stabilizer is typically attached to the holder, the coldness influx stabilizer will stay in the same location by counter acting action of the goniometer.

In an example the present cooler comprises a second container 71b for a second coolant 73b, wherein a boiling point of the second coolant is at least 2 K below a boiling point of the first coolant, preferably 10 K. The second container may be embedded in the first coolant, or the second container may be embedded in the wall of the first container, or the second container may be in thermal connection with the liquid of the first container, such as by a heat exchanger, such as a spiral tube. In an example the first coolant is (liquid) nitrogen and the second coolant is (liquid) helium. As an alternative to liquid nitrogen liquid carbondioxide or a $CO_2$(solid)-acetone mixture may be used.

In an example the present cooler comprises a temperature sensor 38, and a coolant replenish unit controller 87b, wherein the temperature sensor is capable of providing a signal to the replenish unit controller, wherein the coolant replenish unit controller is adapted to open or close the coolant replenish unit. The controller 87b may have a sensor for detecting a level of the first coolant 870.

In a third aspect the present invention relates to a microscope selected from an electron microscope, an ion microscope, an atomic force microscope, and an optical microscope, such as a TEM, a SEM, a transmission mode SEM, an STM, an FIB microscope, preferably using He ions, comprising a holder according to the invention.

In an example the present microscope comprises one or more of a control means selected from a controller, an ampere meter, a voltage meter, a heating means, a radiation source, a means for receiving the holder, an image forming device, and a cooler according to the invention.

The holder is specifically designed to be incorporated into a microscope, such as an electron microscope, and to be manipulated therein.

As a high degree of integration of various components and functions is provided by the present invention also e.g. a high degree of reliability is provided.

In an example the microscope comprises an electron microscope, such as a TEM and SEM, and an optical microscope integrated therein. That is both techniques can be used to analyse a sample in the present holder.

In a fourth aspect the invention relates to a vacuum tight heat flow reductor 97 for cryotransfer, the heat flow reductor comprising a metal grid, and a metal film covering the heat flow reductor at the inside.

It is noted that the term "substantial" is intended to indicate that within a given accuracy, such as measurement, manufacturing, etc. elements are e.g. in line, etc.

The one or more of the above examples and embodiments may be combined, falling within the scope of the invention.

EXAMPLES

The table below presents some indication relating to preferred requirements of the present holder in view of intended uses thereof.

TABLE 1 functional use of various elements of the present invention.

| | $+\alpha/-\alpha$ Rotation | First Heater | Second Heater | Specimen Heater | Double tilt |
|---|---|---|---|---|---|
| Life Science | ±70° | Y | Y | n | n |
| Mat. Science | ±30° | Y | Y | Y | often |

If the temperature can be maintained below the boiling point of nitrogen other applications are envisaged as well. A temperature lower than that of the boiling point of nitrogen requires less strict constraints, e.g. on a beard.

In summary at least two temperature regimes can be identified. A first, between 70-130° K, especially suited life science applications and biological samples. It is important to fixate a sample, at a low enough temperature, and preferably a very constant temperature. A second, wherein the temperature may be constant, or may increase or decrease (rapidly), especially suited for material science applications, wherein a temperature is preferably as constant as possible and wherein specimen drift is very low. Within the second regime development over time of a sample, e.g. a phase transition, can be followed.

The invention is further detailed by the accompanying figures, which are exemplary and explanatory of nature and are not limiting the scope of the invention. To the person skilled in the art it may be clear that many variants, being obvious or not, may be conceivable falling within the scope of protection, defined by the present claims.

SUMMARY OF FIGURES

The invention although described in detailed explanatory context may be best understood in conjunction with the accompanying figures.

FIG. 1 shows a holder according to the invention.
FIG. 2a shows a coldness influx stabilizer according to the invention.
FIG. 2b shows a counter rotation device.

DETAILED DESCRIPTION OF THE FIGURES

List of Elements

Figure 3:
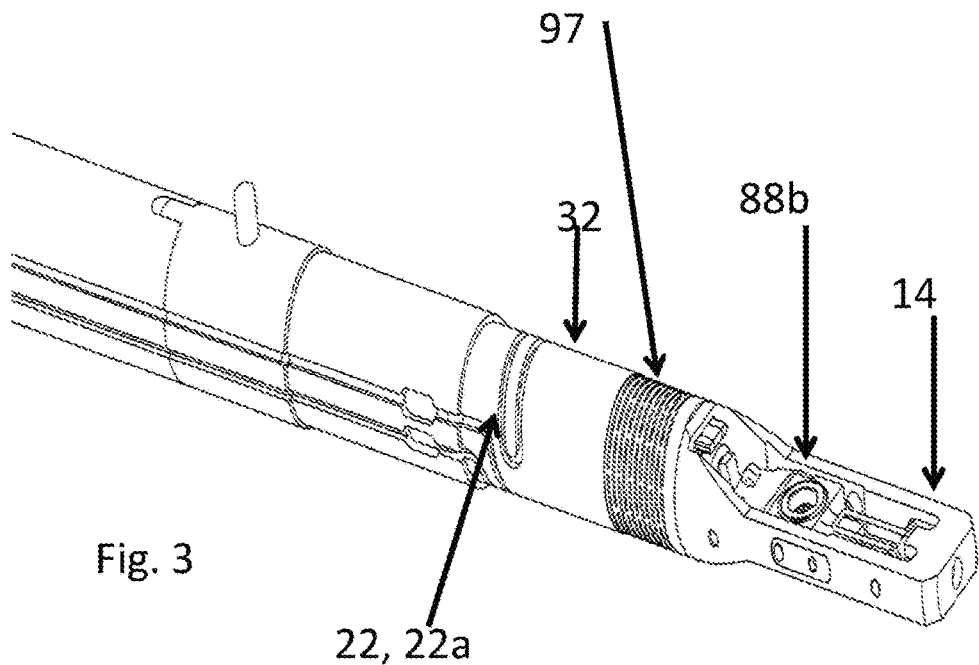
FIG. 3 shows a tip section according to the invention.

100: Holder
200: Cooler
11a: solid thermal conducting part coldness influx stabilizer
13a: Outer Section holder
13b: Inner section holder
14: Specimen cradle
21: First heat provider
21a: groove for heating wire
22: Second heat provider
22a: groove for heating wire
23: Micro heat provider
23a: Master micro heat provider
23b: Slave micro heat provider
24: holder tip microheat provider
31: First temperature sensor
31a: groove for temperature sensor
32: Second temperature sensor
33: Temperature sensor micro heater
33a: Temperature sensor sample
34: Temperature sensor tip
38: Temperature sensor cooler
43a: coldness influx stabilizer support
43b: Inner section support c.q. resonance damper
43c: Tip support
59: tip needles
70: coldness influx stabilizer
71: cooler container
71b: second cooler container
73: first coolant
73b: second coolant
73e: surface area of coolant
76a: first outlet
76e: opening having surface area
77: first coolant replenish unit
77a: inlet
77b: valve
77e: first small inlet having surface area
79: beard
81: Heat regulator of first heat provider
87b: coolant replenish unit controller
87c: sensor
88: Goniometer
88a: controller for manipulating a sample
88b: multiple tilt device (cradle) for sample
89: counter rotation device
89a: rotation α
89b: counter rotation α

89c: counter rotation part
92: opening
93: bridging element
97: a (Ti) grid heat flow reductor
98: thermal expansion regulator FIG. 1 shows a holder according to the invention. The holder has been described throughout the description.

FIG. 2a shows a coldness influx stabilizer according to the invention. Therein a groove 21a for a heating wire and the heating wire 21, as well as a groove 31a for a temperature sensor and the temperature sensor 31 are shown.

FIG. 2b shows a counter rotation device 89. Therein a goniometer 88 is shown, intended to rotate over an angle α (89a). To counter act rotation of the coldness influx stabilizer 70 (top part thereof indicated) and beard 79 attached thereto a counter rotation −α (89b) is obtained by rotating counter rotation element 89c over the angle −α. Clearly α is ∈ [−90,90](degrees). Further the outer section 13a is identified.

FIG. 3 shows a tip section according to the invention. Therein a Ti grid 97 for reducing heat transfer, a multiple tilt cradle 88b, an outside section heater 22 in the form of a heating wire embedded in a groove 22a, and an outside section temperature sensor 32 are shown.

Figure 4:
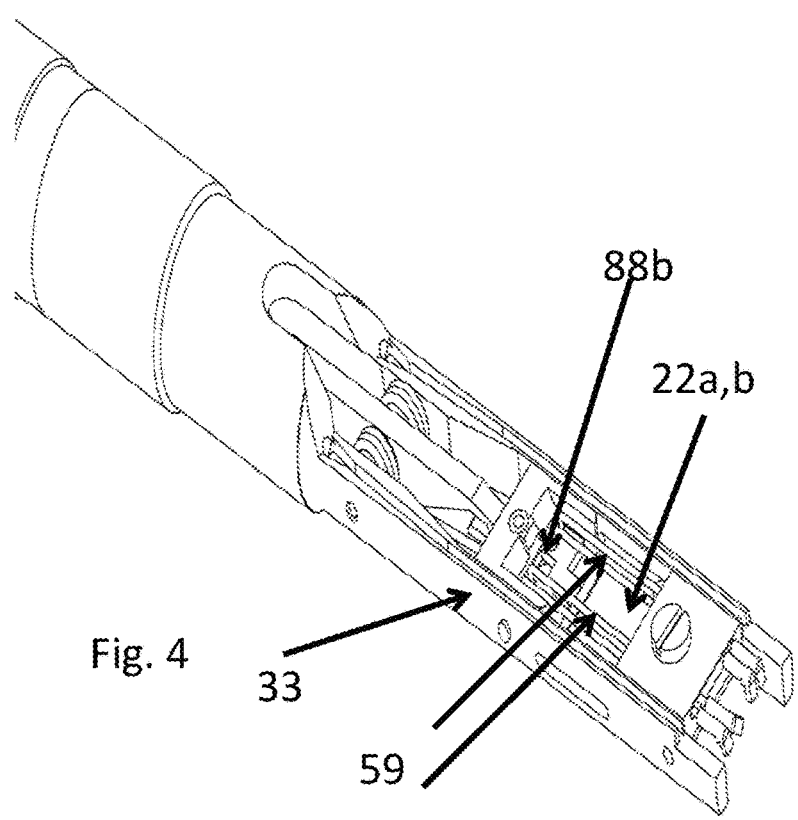
FIG. 4 shows a cradle according to the invention.

FIG. 4 shows a cradle 14 according to the invention. Therein one or more tip micro heaters 22a-b (schematically indicated), one or more sample temperature sensors 33, a multiple tilt cradle 88b for manipulating a sample over multiple angles, needles 59 for electrically contacting a chip to electrical wires, the wires being connected to outside controllers, heaters, etc.

Figure 5:
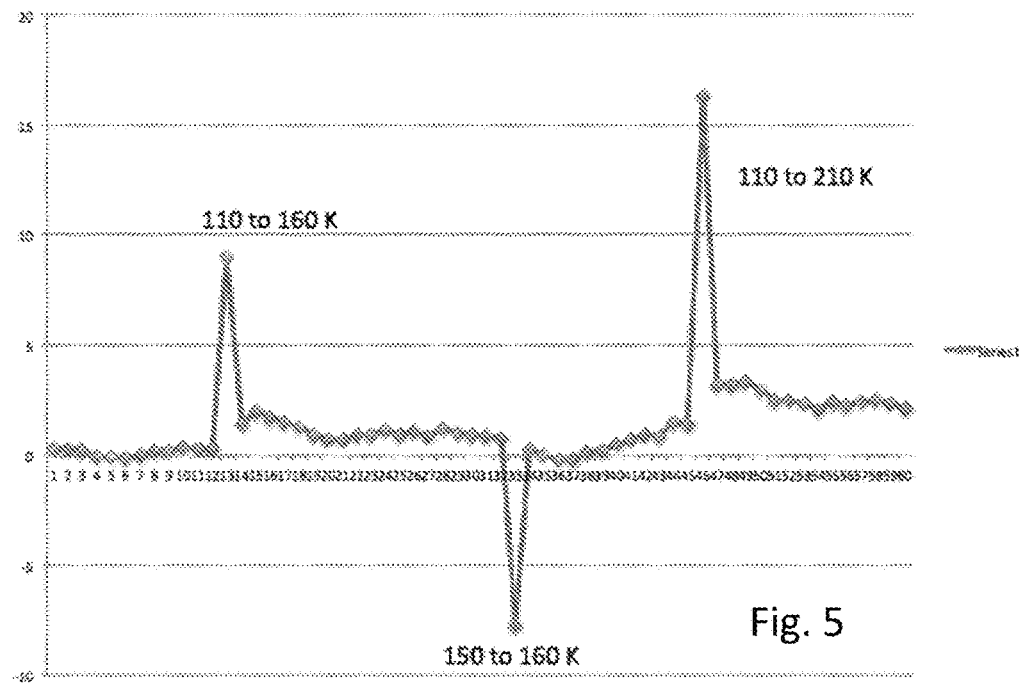
FIG. 5 shows an example of the effect of a change in T. Vertical axis is in Å per second.

FIG. 5 shows an example of the effect of a change in T by heater 23 on the resolution. Vertical axis is in Å per second. Therein a very good temperature stability is shown over time. When increasing the temperature relatively rapid, such as from 110 to 160° K., or likewise from 110 to 210° K., a temporarily deterioration of resolution occurs. At the right hand end of the figure the amount of coolant is dropping low, and as a result the resolution is somewhat reduced. Over all the resolution is maintained fairly constant over a long period of time (15 minutes-2 hours), which is considered more than long enough to carry out experiments of interest. If liquid nitrogen is added slowly, such that the liquid nitrogen level is more or less kept constant, this period can be more than 5 hours.

Figure 6:
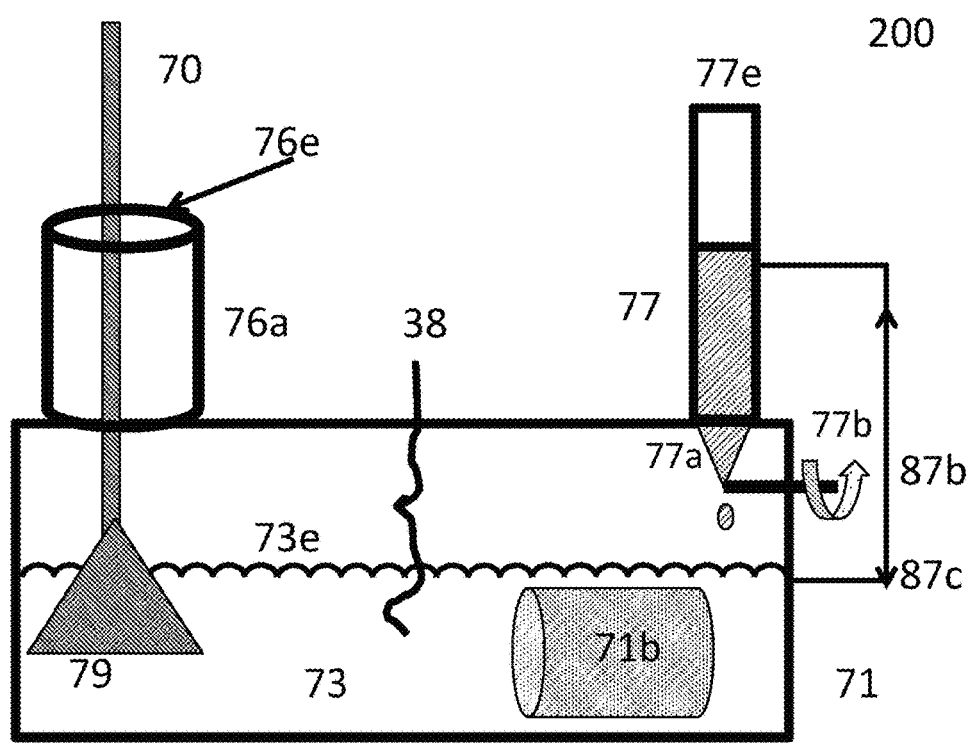
FIG. 6 shows a cooler according to the invention.

FIG. 6 shows a cooler according to the invention. Therein a container 71 is shown, comprising a first liquid coolant 73, such as nitrogen. Through a small inlet 77a, using a regulator 77b (such as a valve), droplets of liquid coolant are provided from a coolant replenish unit 77 in order to replenish the amount of coolant. A sensor 87c is provided for monitoring an amount of coolant, typically by monitoring a height level thereof. Further a temperature sensor 38 is provided to determining the temperature. The temperature measurement may be used to further regulate the regulator 77b. Further a first outlet 76a is provided, having a relatively larger cross section (surface area) 76e in comparison with that of the small inlet 77e. The surface area 76e is in the example about 2% of a surface area 73e of the liquid coolant. The coldness influx stabilizer 70, and a copper beard 79 are provided through the first outlet. Optionally a second container 71b is provided, comprising a second coolant, such as liquid He, having a lower boiling point than the first coolant. The second container may be introduced as indicated in the first coolant. In an alternative the second container may be comprised in the (double) wall of the first container 71.

Figure 7:
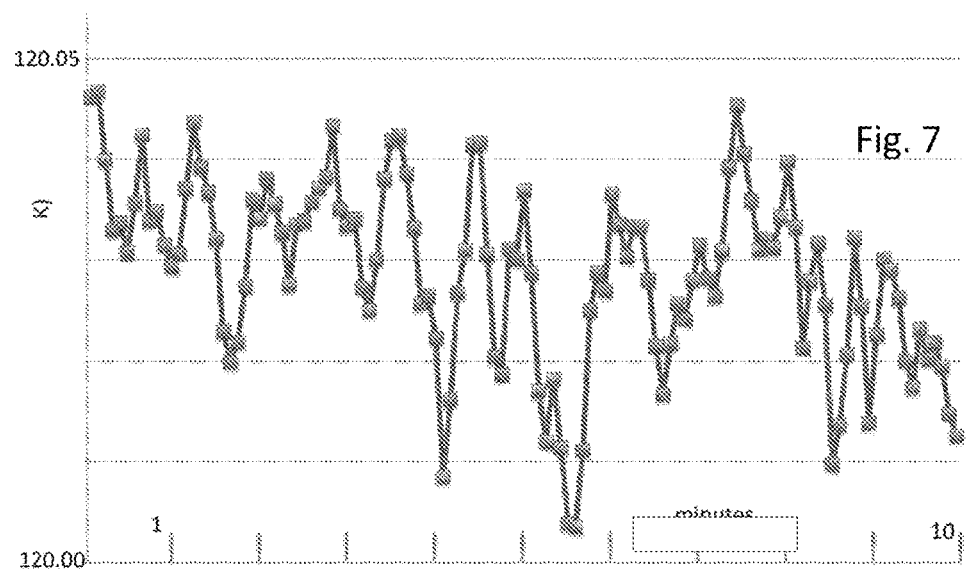
FIG. 7 shows temperature fluctuations in the coldness influx regulator.

FIG. 7 shows temperature fluctuations in the coldness influx regulator. Therein a variation of 0.05 K (temperature on vertical axis) in the coldness influx regulator does not lead to any observable correlated movement of the specimen in the tip over time (minutes on horizontal axis). It is noted that a real jump of 0.01 K results in a shift in the specimen position of about 1 nm.

Figure 8A:
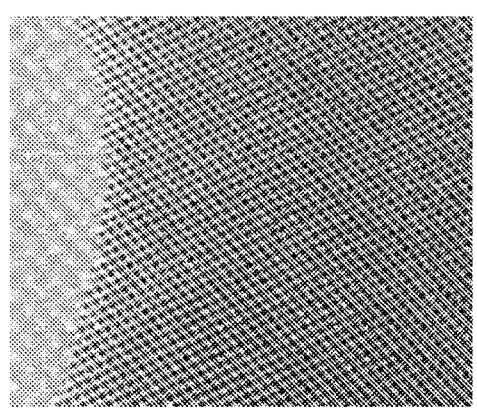
FIG. 8a shows an HREM Au image taken at 100 K, and FIG. 8b a Fourier Transform showing information beyond 0.1 nm (0.1 nm indicated by circle).

FIG. 8a shows an HREM Au [111] image taken at 100 K. Therein it can clearly be seen that individual atoms, as well as the hexagonal structure of the lattice, can be identified.

Figure 8B:
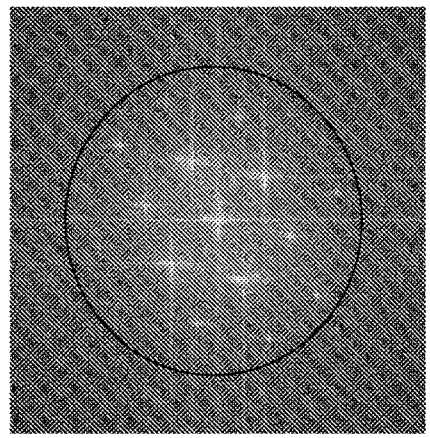

FIG. 8b gives a Fourier Transform, indicating resolution of the picture of FIG. 8a. It shows that information beyond 0.1 nm (0.1 nm is indicated by the circle) is obtained, i.e. a resolution of better than 0.1 nm.

Figure 9:
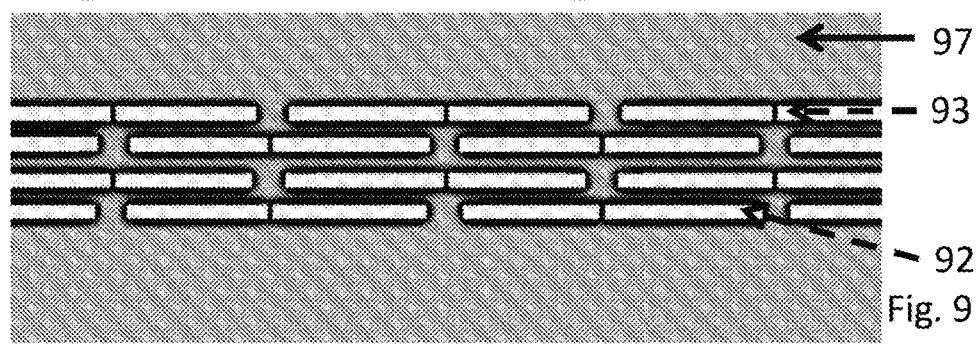
FIG. 9 shows an example of a grid.

FIG. 9 shows an example of a grid, and is detailed further in the description.

What is claimed is:

1. A low specimen drift holder for providing mechanical and temperature stability, allowing controlled change of specimen temperature, wherein the holder comprises
    (i) an inner section,
    (ii) an outer section, wherein the outer section comprises supports for supporting the inner section, and wherein the supports are of a thermally insulating material,
    (iii) a coldness influx stabilizer connected to the inner section,
    (iv) a first heat provider for at least one of maintaining the inner section at a predetermined temperature (T5) and heating the inner section at a predetermined rate, wherein first heat provider comprises a temperature sensor capable of detecting temperature changes in the order of mK, software and a heat regulator, wherein the first heat provider has a maximum power of 10 W-1 kW, wherein the heat regulator is adapted to damp temperature fluctuation in the inner section by modifying an amount of heat provided by heater in order to maintain an average temperature within 50 mK fluctuation (per 10 seconds (1/30 Hz)),
    (v) a second heat provider for maintaining the outer section at a predetermined temperature (T1), wherein a second heat provider has a maximum power of 0.001 W-10 W, and
    (vi) a heat flow reductor adapted to minimize heat flux from outer section to a tip.

2. The holder according to claim 1, wherein the heat regulator is adapted to damp temperature fluctuation in the inner section by modifying an amount of heat provided by heater in order to maintain an average temperature within 10 mK fluctuation (per 10 seconds (1/30 Hz)).

3. The holder according to claim 1, wherein the coldness influx stabilizer comprises a solid thermal conducting part, having a volume of 1-100 cm$^3$, a surface area of 1-200 cm$^2$, having a thermal heat conductivity λ of >50 (W/(mK, @ 293 K).

4. The holder according to claim 1, wherein the second heat provider comprises a heating wire, having a maximum heat capacity of 0.1 mW-10 W.

5. The holder according to claim 1, wherein the second heat provider comprises a temperature sensor.

6. The holder according to claim 1, further comprising a specimen microheat provider, having a maximum heat capacity 0.01 mW-1 W.

7. The holder according to claim 6, wherein the specimen microheat provider comprises a first electrically controlled heat device.

8. The holder according to claim 6, additionally comprising a temperature sensor.

9. The holder according to claim 1, wherein the inner section comprises at least one internal resonance damper attached to the outer section.

10. The holder according to claim 1, wherein the coldness influx stabilizer comprises a high surface/volume ratio coolant contact element.

11. The holder according to claim 1, further comprising a counter rotation device, wherein the counter rotation device is capable of counter rotating the coldness influx stabilizer over an angle of ±90 degrees.

12. The holder according to claim 1, wherein the heat flow reductor comprises a metal grid, and a metal film covering the metal grid section of the heat flow reductor at the inside thereby forming a sealing.

13. A microscope selected from an electron microscope an ion microscope, an atomic force microscope, and an optical microscope, comprising a holder according to claim 1, and
    a cooler for providing mechanical and temperature stability to a sample in the microscope, comprising a container for a first coolant, a first small inlet, a first outlet comprising an opening for a coldness influx stabilizer, and a first coolant replenish unit, wherein a surface area of the outlet is smaller than 25% of a surface area of the coolant.

14. The microscope according to claim 13, wherein the cooler further comprises at least one of a second container for a second coolant, wherein a boiling point of the second coolant is at least 2 K below a boiling point of the first coolant, wherein the second container is embedded in the first coolant, or wherein the second container is embedded in a wall of the first container,
    a temperature sensor, wherein the temperature sensor is capable of providing a signal to the replenish unit controller, and
    a coolant replenish unit controller, wherein the coolant replenish unit controller is adapted to open or close the coolant replenish unit.

* * * * *